(12) United States Patent
Nakamura et al.

(10) Patent No.: US 7,030,413 B2
(45) Date of Patent: Apr. 18, 2006

(54) PHOTOVOLTAIC DEVICE WITH INTRINSIC AMORPHOUS FILM AT JUNCTION, HAVING VARIED OPTICAL BAND GAP THROUGH THICKNESS THEREOF

(75) Inventors: Noboru Nakamura, Uji (JP); Mikio Taguchi, Hirakata (JP); Kunihiro Kawamoto, Higashiosaka (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 0 days.

(21) Appl. No.: 09/947,317

(22) Filed: Sep. 5, 2001

(65) Prior Publication Data

US 2002/0069911 A1    Jun. 13, 2002

(30) Foreign Application Priority Data

Sep. 5, 2000 (JP) .............................. 2000-268199

(51) Int. Cl.
*H01L 27/15* (2006.01)
*H01L 31/12* (2006.01)
*H01L 33/00* (2006.01)

(52) U.S. Cl. ........................................ 257/79; 136/243

(58) Field of Classification Search ........ 136/255–258, 136/243, 249; 257/13, 79–103, 918, 77, 257/185, 458
See application file for complete search history.

(56) References Cited

U.S. PATENT DOCUMENTS

| | | | |
|---|---|---|---|
| 4,109,271 A * | 8/1978 | Pankove | 357/30 |
| 4,471,155 A * | 9/1984 | Mohr et al. | 136/258 |
| 4,485,389 A * | 11/1984 | Ovshinsky et al. | 357/2 |
| 4,717,637 A * | 1/1988 | Yoshizawa et al. | 430/65 |
| 4,766,471 A * | 8/1988 | Ovshinsky et al. | 357/19 |
| 4,769,682 A * | 9/1988 | Yang et al. | 357/2 |
| 4,782,376 A * | 11/1988 | Catalano | 357/30 |
| 4,816,082 A * | 3/1989 | Guha et al. | 136/249 |
| 5,066,340 A * | 11/1991 | Iwamoto et al. | 136/258 |
| 5,114,498 A * | 5/1992 | Okamoto et al. | 136/258 |
| 5,213,628 A | 5/1993 | Noguchi et al. | |
| 5,395,457 A * | 3/1995 | Sano et al. | 136/256 |
| 5,419,783 A * | 5/1995 | Noguchi et al. | 136/258 |
| 5,693,957 A * | 12/1997 | Sano et al. | 257/51 |
| 5,705,828 A * | 1/1998 | Noguchi et al. | 257/53 |
| 5,716,480 A * | 2/1998 | Matsuyama et al. | 136/249 |
| 5,935,344 A * | 8/1999 | Endo et al. | 136/255 |
| 6,077,722 A * | 6/2000 | Jansen et al. | 438/74 |
| 6,121,541 A * | 9/2000 | Arya | 136/255 |

FOREIGN PATENT DOCUMENTS

| | | |
|---|---|---|
| JP | 58067073 | 4/1983 |
| JP | 59075682 | 4/1984 |

(Continued)

OTHER PUBLICATIONS

R.A. Street, "Hydrogenated amorphous silicon", Cambridge University Press, Cambridge, Great Britain, 1991, pp. 363-365.

*Primary Examiner*—Mary Wilczewski
*Assistant Examiner*—Monica Lewis
(74) *Attorney, Agent, or Firm*—W. F. Fasse; W. F. Fasse

(57) ABSTRACT

In a photovoltaic device comprising a thin intrinsic amorphous semiconductor film inserted in a junction portion of a crystalline semiconductor substrate and an amorphous semiconductor film which have conductive types reverse to each other, an optical band gap of the intrinsic amorphous semiconductor film is expanded on a side in contact with the amorphous semiconductor film.

15 Claims, 5 Drawing Sheets

FOREIGN PATENT DOCUMENTS

| | | |
|---|---|---|
| JP | 61030079 | 2/1986 |
| JP | 02260664 | 10/1990 |
| JP | 03084966 | 4/1991 |
| JP | 04286167 | 10/1992 |
| JP | 05048130 | 2/1993 |
| JP | 06291342 | 10/1994 |
| JP | 06291343 | 10/1994 |
| JP | 07131041 | 5/1995 |
| JP | 07142753 | 6/1995 |
| JP | 08023114 | 1/1996 |
| JP | 09129904 | 5/1997 |
| JP | 2000150935 | 5/2000 |

\* cited by examiner

PHOTOVOLTAIC DEVICE WITH INTRINSIC AMORPHOUS FILM AT JUNCTION, HAVING VARIED OPTICAL BAND GAP THROUGH THICKNESS THEREOF

BACKGROUND OF THE INVENTION

1. Field of the Invention

The present invention relates to a photovoltaic device, and more particularly to a photovoltaic device comprising a semiconductor junction of a crystalline semiconductor such as a single crystalline semiconductor or a polycrystalline semiconductor and an amorphous semiconductor.

2. Related Art

In recent years, there has vigorously been developed a photovoltaic device using a thin film semiconductor. The area of a photovoltaic device using a thin film semiconductor as a power generating layer can easily be increased and the basic requirements for the photovoltaic device such as a solar cell can be satisfied sufficiently.

However, since the thin film semiconductor has a disordered crystalline structure, it has a large number of unbonded sites or ends on a crystalline structure and is not a good material as compared with the crystalline semiconductor. For this reason, there is a problem in that a high photoelectric conversion efficiency cannot be obtained.

In order to solve such a problem, there has been proposed a photovoltaic device in which a crystalline semiconductor substrate and an amorphous semiconductor film having conductive types reverse to each other are bonded. In such a photovoltaic device, since the crystalline semiconductor substrate is used as a power generating layer, a high photoelectric conversion efficiency can be obtained.

Moreover, there has been proposed a photovoltaic device having such a structure that a thin intrinsic amorphous semiconductor film is inserted between a crystalline semiconductor substrate and an amorphous semiconductor film so as not to substantially contribute to power generation in order to reduce the recombination of photo-generated carriers in an interface state generated by a semiconductor junction.

In recent years, however, the application of solar cells has begun to expand to use for personal houses, and an expectation for solar cells to provide clean energy has been increased. Furthermore, it has been required that the conversion efficiency of the photovoltaic device can be further enhanced.

SUMMARY OF THE INVENTION

It is an object of the present invention to provide a photovoltaic device capable of further reducing the recombination of photo-generated carriers in a semiconductor junction portion, thereby enhancing a photoelectric conversion efficiency.

The present invention provides a photovoltaic device comprising a crystalline semiconductor substrate having one conductive type, an amorphous semiconductor film having a conductive type reverse to that of the crystalline semiconductor substrate, and a thin intrinsic amorphous semiconductor film inserted in a junction portion of the crystalline semiconductor substrate and the amorphous semiconductor film, wherein an optical band gap of the intrinsic amorphous semiconductor film is expanded on a side in contact with the amorphous semiconductor film.

In the present invention, the optical band gap of the intrinsic amorphous semiconductor film is expanded toward the amorphous semiconductor film side. The optical band gap may be expanded continuously or a plurality of layers may be provided such that the band gap is expanded stepwise.

In the case in which a plurality of layers are to be provided, different semiconductor materials may be provided. For example, an amorphous silicon (a-Si) layer may be provided on the crystalline semiconductor substrate side and an amorphous silicon carbide (a-SiC) layer, an amorphous silicon oxide (a-SiO) layer or an amorphous silicon nitride (a-SiN) layer may be provided on the amorphous semiconductor film side. In this case, it is preferable that the amorphous silicon layer has a thickness of 5 nm or less.

In the case in which the amorphous silicon carbide layer, the amorphous silicon oxide layer or the amorphous silicon nitride layer is to be used in the intrinsic amorphous semiconductor film, the concentration of carbon, oxygen or nitrogen in these layers may be gradually increased apart from the substrate. By providing such a graded structure, it is possible to form such an optical band gap as to be gradually expanded apart from the substrate.

When the amorphous silicon layer contains hydrogen, the optical band gap is increased. By forming the amorphous silicon layer as the intrinsic amorphous semiconductor film and gradually increasing the amount of hydrogen to be contained in the amorphous silicon layer to approach the amorphous semiconductor film side, therefore, the optical band gap may be expanded. Moreover, an amorphous silicon layer may be provided in a different amount of hydrogen to be contained. More specifically, an amorphous silicon layer having a relatively low amount of hydrogen to be contained may be provided on the crystalline semiconductor substrate side and an amorphous silicon layer having a relatively high amount of hydrogen to be contained may be provided on the amorphous semiconductor film side. In this case, it is preferable that the amorphous silicon layer provided on the crystalline semiconductor substrate side should have a thickness of 1 to 7 nm and more preferably 3 to 6 nm.

In the present invention, the whole intrinsic amorphous semiconductor film has such a thickness as not to form a power generating layer, for example, 20 to 250 Å.

The crystalline semiconductor substrate to be used in the present invention is a single crystalline semiconductor substrate or a polycrystalline semiconductor substrate, for example. Moreover, a microcrystalline semiconductor substrate or a thin film polycrystalline semiconductor substrate may be used. The amorphous semiconductor film to be used in the present invention also includes a microcrystalline semiconductors film such as a thin microcrystalline silicon film.

In the photovoltaic device in which the crystalline semiconductor substrate and the amorphous semiconductor film having conductive types reverse to each other are bonded, the intrinsic amorphous semiconductor film inserted in a junction interface to reduce the recombination of photo-generated carriers in the interface state generated by a semiconductor junction produces greater advantages with a finer structure and also causes a current loss due to an increase in light absorption on the same film. In order to suppress the current loss, it is proposed that the thickness of the intrinsic amorphous semiconductor film is reduced. However, if the thickness is too reduced, a built-in potential is lowered in the photovoltaic device so that an open circuit voltage is dropped.

In the present invention, the intrinsic amorphous semiconductor film having the optical band gap expanded on the side in contact with the amorphous semiconductor film is used as the intrinsic amorphous semiconductor film to be inserted in the junction interface of the crystalline semiconductor substrate and the amorphous semiconductor film.

In other words, the intrinsic amorphous semiconductor layer of high quality is provided on the crystalline semiconductor substrate side, while the intrinsic amorphous semiconductor layer having a large optical band gap, that is, a wide gap is provided on the amorphous semiconductor film side. By providing the intrinsic amorphous semiconductor layer having the wide gap, thus, it is possible to decrease a current loss due to an increase in the light absorption and the built-in potential can also be prevented from being reduced. Accordingly, it is possible to obtain a photovoltaic device having a photoelectric conversion efficiency enhanced.

DESCRIPTION OF THE PREFERRED EMBODIMENTS (First Embodiment)

Figure 1:
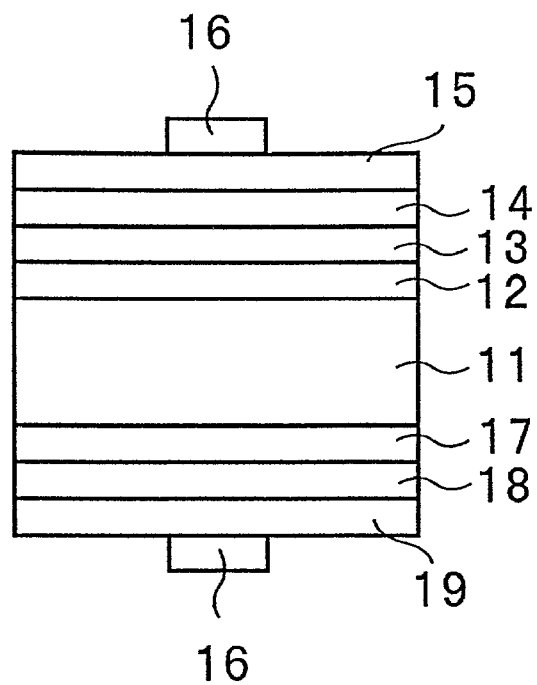
FIG. 1 is a typical sectional view showing a photovoltaic device according to a first embodiment of the present invention.

FIG. 1 is a typical sectional view showing a photovoltaic device according to a first embodiment of the present invention. With reference to FIG. 1, an intrinsic amorphous silicon layer 12 is formed on the light incidence side of an n-type single crystalline silicon substrate 11. An intrinsic amorphous silicon carbide layer 13 is formed on the intrinsic amorphous silicon layer 12. The intrinsic amorphous semiconductor film according to the present invention is constituted by the intrinsic amorphous silicon layer 12 and the intrinsic amorphous silicon carbide layer 13. A p-type amorphous silicon film 14 is formed on the intrinsic amorphous silicon carbide layer 13. A transparent electrode 15 is formed on the p-type amorphous silicon film 14 and a collector electrode 16 is provided on the transparent electrode 15.

An intrinsic amorphous silicon layer 17 is formed on the back face side of the n-type single crystalline silicon substrate 11 and an n-type amorphous silicon film 18 is formed on the intrinsic amorphous silicon layer 17. A BSF (back surface field) region is formed by the intrinsic amorphous silicon film 17 and the n-type amorphous silicon film 18. A back electrode 19 is formed on the n-type amorphous silicon film 18 and the collector electrode 16 is provided on the back electrode 19.

The conditions of the formation of the semiconductor film and the electrode which are to be provided on the light incidence side are as follows.

The intrinsic amorphous silicon layer 12 is formed by a plasma CVD method on the condition of an $SiH_4$ gas flow rate of 60 sccm, an $H_2$ gas flow rate of 60 sccm, a pressure of 40 Pa, a substrate temperature of 170° C. and an RF power of 30 W. A thickness is 3 nm and an optical band gap is 1.54 eV.

The intrinsic amorphous silicon carbide layer 13 is formed by the plasma CVD method on the condition of an $SiH_4$ gas flow rate of 40 sccm, a $CH_4$ gas flow rate of 40 sccm, a pressure of 40 Pa, a substrate temperature of 170° C. and an RF power of 30 W. A thickness is 5 nm and an optical band gap is 1.76 eV.

The p-type amorphous silicon film 14 is formed by the plasma CVD method on the condition of an $SiH_4$ gas flow rate of 40 sccm, a $B_2H_6$ gas (1% $H_2$ base) flow rate of 80 sccm, a pressure of 40 Pa, a substrate temperature of 170° C. and an RF power of 30 W. A thickness is 3 nm.

The transparent electrode 15 is formed of indium tin oxide (ITO) by sputtering. The condition of the formation includes a substrate temperature of 180° C., an Ar gas flow rate of 70 sccm, an $O_2$ gas flow rate of 5 sccm, a pressure of 0.7 Pa, and an RF power of 800 W. A thickness is 100 nm. 5% $O_2$ (Ar base) is used as the $O_2$ gas.

The semiconductor film and electrode on the back face side are formed on the following conditions.

The intrinsic amorphous silicon layer 17 is formed by the plasma CVD method on the condition of an $SiH_4$ gas flow rate of 60 sccm, an $H_2$ gas flow rate of 60 sccm, a pressure of 40 Pa, a substrate temperature of 170° C. and an RF power of 30 W. A thickness is 15 nm and an optical band gap is 1.54 eV.

The n-type amorphous silicon film 18 is formed by the plasma CVD method on the condition of an $SiH_4$ gas flow rate of 40 sccm, a $PH_3$ gas (2% $H_2$ base) flow rate of 20 sccm, a pressure of 30 Pa, a substrate temperature of 170° C. and an RF power of 30 W. A thickness is 22 nm.

The back electrode 19 is formed in the same manner as the transparent electrode 15.

Figure 3:
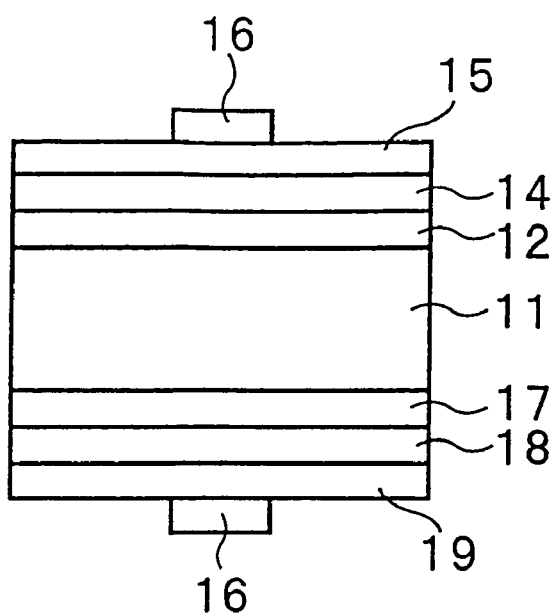
FIG. 3 is a typical sectional view showing a photovoltaic device according to a conventional example for a comparison.

As a conventional example for a comparison, a photovoltaic device having a structure shown in FIG. 3 is fabricated. The photovoltaic device is formed in the same manner as that according to the first embodiment shown in FIG. 1 except that the intrinsic amorphous silicon carbide layer 13 is not formed. The intrinsic amorphous silicon layer 12 has a thickness of 8 nm.

For the photovoltaic device according to the first embodiment thus fabricated and the photovoltaic device according to the conventional example, an open circuit voltage (Voc) and a short circuit current (Isc) are measured, which are shown in Table 1.

TABLE 1

|  | Voc (V) | Isc (A) |
| --- | --- | --- |
| Conventional example | 0.675 | 3.87 |
| Present invention | 0.675 | 3.91 |

As is apparent from the Table 1, the photovoltaic device according to the first embodiment of the present invention has a short circuit current more enhanced and a conversion efficiency more increased than the photovoltaic device according to the conventional example.

Figure 6:
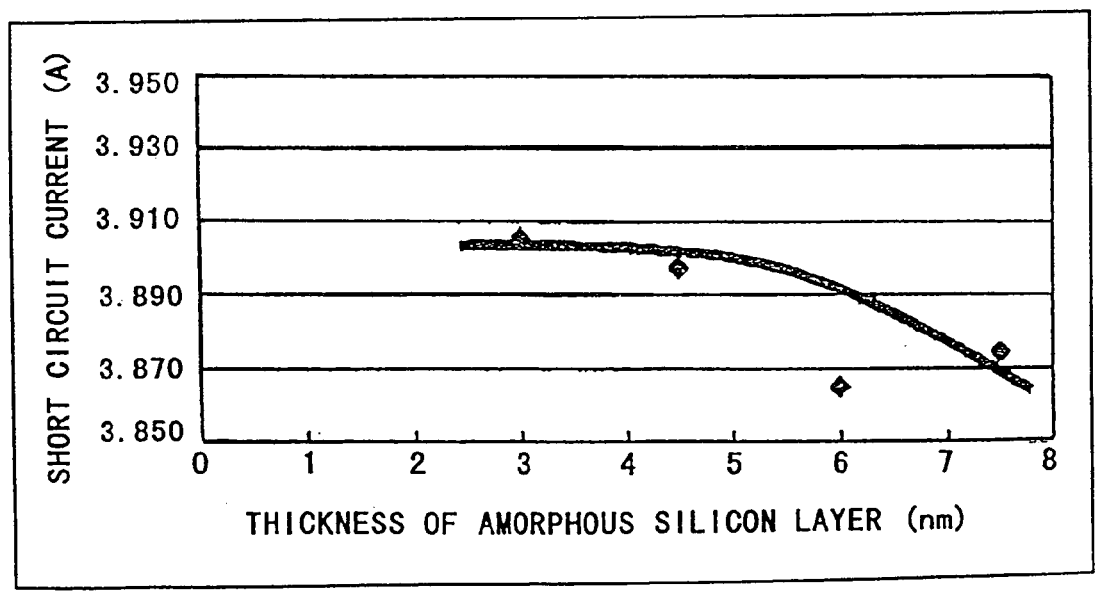
FIG. 6 is a chart showing a short circuit current obtained when the thickness of an amorphous silicon layer is changed in the first embodiment according to the present invention.
Figure 7:
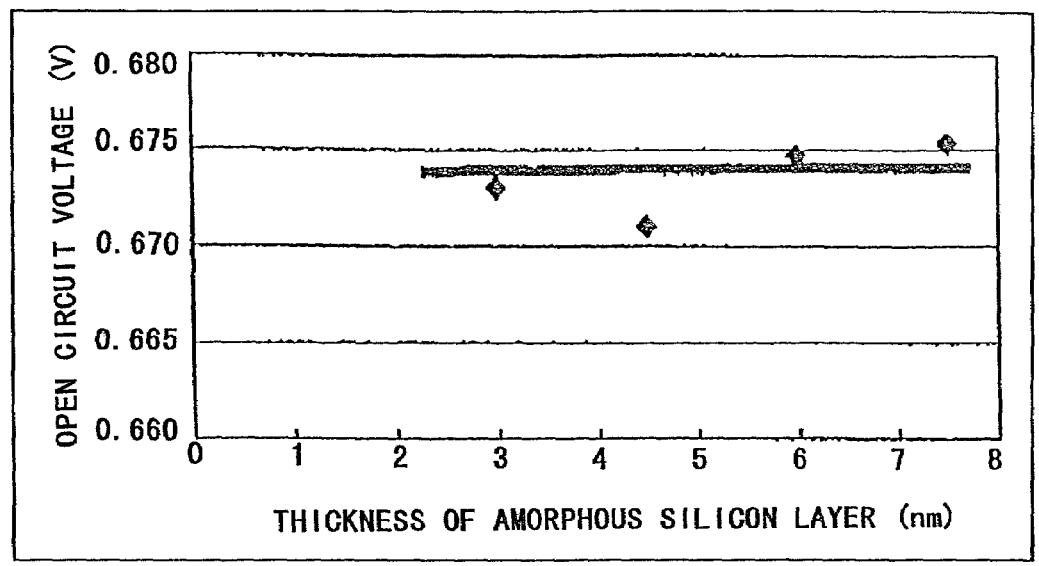
FIG. 7 is a chart showing an open circuit voltage obtained when the thickness of the amorphous silicon layer is changed in the first embodiment according to the present invention.

Next, the thickness of the whole intrinsic amorphous semiconductor film is set to be constant, that is, 7.5 nm and the thicknesses of the intrinsic amorphous silicon layer 12 and the intrinsic amorphous silicon carbide layer 13 are varied respectively to fabricate the photovoltaic device. An open circuit voltage and a short circuit current are measured. The result of the measurement is shown in FIGS. 6 and 7. The conditions of formation except for the thickness are the same as those in the above-mentioned embodiment.

As is apparent from FIGS. 6 and 7, the short circuit current is increased in the present embodiment in the same manner as in the above-mentioned embodiment. In particular, excellent characteristics can be obtained by setting the thickness of the amorphous silicon layer to 5 nm or less. If the whole intrinsic amorphous semiconductor film is constituted by the amorphous silicon carbide layer, the film quality is more deteriorated than the amorphous silicon. Therefore, there is a lessening of the effect of reducing the recombination of the photo-generated carriers in the interface state generated by the semiconductor junction of the crystalline semiconductor substrate and the amorphous semiconductor film. Consequently, it is preferable that the amorphous silicon layer should have a thickness of at least several Å, for example, 1 nm or more.

(Second Embodiment)

Figure 2:
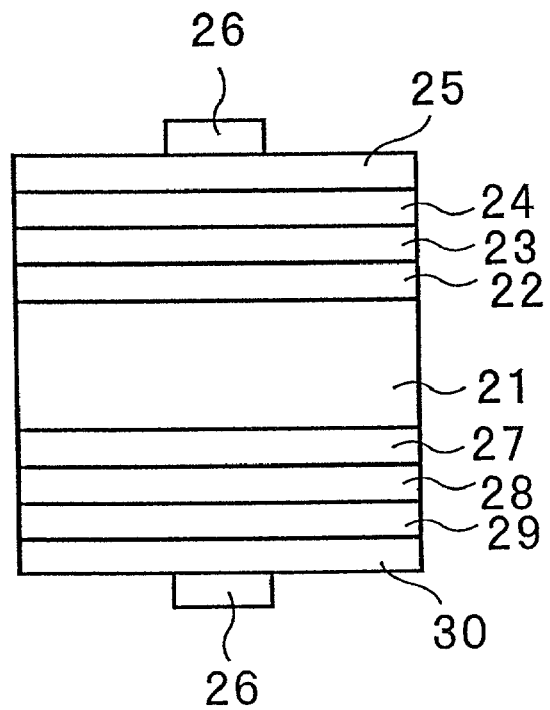
FIG. 2 is a typical sectional view showing a photovoltaic device according to a second embodiment of the present invention.

FIG. 2 is a typical sectional view showing a photovoltaic device according to a second embodiment of the present invention.

With reference to FIG. 2, an intrinsic amorphous silicon layer 22 is formed on the light incidence side of an n-type single crystalline silicon substrate 21 and an intrinsic amorphous silicon carbide layer 23 is formed on the intrinsic amorphous silicon layer 22. The intrinsic amorphous semiconductor film according to the present invention is constituted by the intrinsic amorphous silicon layer 22 and the intrinsic amorphous silicon carbide layer 23. A p-type amorphous silicon film 24 is formed on the intrinsic amorphous silicon carbide layer 23, and a transparent electrode 25 and a collector electrode 26 are formed on the p-type amorphous silicon film 24.

An intrinsic amorphous silicon layer 27 is formed on the back face side of the n-type single crystalline silicon substrate 21 and an intrinsic amorphous silicon carbide layer 28 is formed on the intrinsic amorphous silicon layer 27. The intrinsic amorphous semiconductor film according to the present invention is constituted by the intrinsic amorphous silicon layer 27 and the intrinsic amorphous silicon carbide layer 28. An n-type amorphous silicon film 29 is formed on the intrinsic amorphous silicon carbide layer 28. A back electrode 30 and a collector electrode 26 are formed on the n-type amorphous silicon film 29.

A BSF region is formed by the intrinsic amorphous silicon layer 27, the intrinsic amorphous silicon carbide layer 28 and the n-type amorphous silicon film 29.

In the embodiment shown in FIG. 2, the semiconductor film and the electrode on the light incidence side are formed in the same manner as the semiconductor film and the electrode on the light incidence side shown in FIG. 1.

The intrinsic amorphous silicon layer 27 on the back face side is formed by the same method and conditions as the formation of the intrinsic amorphous silicon layer 17 according to the embodiment shown in FIG. 1. A thickness is 5 nm.

The intrinsic amorphous silicon carbide layer 28 is formed by the plasma CVD method on the condition of an $SiH_4$ gas flow rate of 40 sccm, a $CH_4$ gas flow rate of 40 sccm, a pressure of 40 Pa, a substrate temperature of 170° C. and an RF power of 30 W. A thickness is 10 nm and an optical band gap is 1.76 eV.

The n-type amorphous silicon film 29 is formed by the same method and conditions as the formation of the n-type amorphous silicon film 18 according to the embodiment shown in FIG. 1. Moreover, the back electrode 30 is also formed by the same method and conditions as the formation of the back electrode 19 according to the embodiment shown in FIG. 1.

Table 2 shows an open circuit voltage and a short circuit current in the photovoltaic device according to the second embodiment. The Table 2 also shows the open circuit voltage and the short circuit current in the photovoltaic device according to the conventional example shown in FIG. 3.

TABLE 2

|  | Voc (V) | Isc (A) |
| --- | --- | --- |
| Conventional example | 0.675 | 3.87 |
| Present invention | 0.681 | 3.93 |

As shown in the Table 2, the photovoltaic device according to the second embodiment of the present invention has an open circuit voltage and a short circuit current more enhanced and a conversion efficiency more increased than the photovoltaic device according to the conventional example.

(Third Embodiment)

Figure 4:
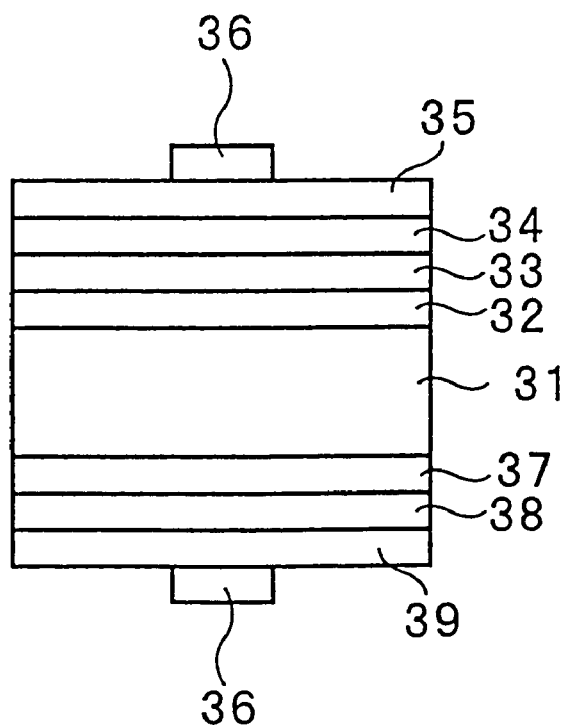
FIG. 4 is a typical sectional view showing a photovoltaic device according to a third embodiment of the present invention.

FIG. 4 is a typical sectional view showing a photovoltaic device according to a third embodiment of the present invention. With reference to FIG. 4, an intrinsic amorphous silicon layer 32 is formed on the light incidence side of an n-type single crystalline silicon substrate 31 and an intrinsic amorphous silicon layer 33 is formed on the intrinsic amorphous silicon layer 32. The intrinsic amorphous silicon layer 33 is formed to have a relatively larger amount of hydrogen to be contained than the intrinsic amorphous silicon layer 32. More specifically, the intrinsic amorphous silicon layer 33 is formed to have an optical band gap expanded with an increase in the amount of hydrogen to be contained. An intrinsic amorphous semiconductor film according to the present invention is constituted by the intrinsic amorphous silicon layer 32 and the intrinsic amorphous silicon layer 33.

A p-type amorphous silicon layer 34 is formed on the intrinsic amorphous silicon layer 33. A transparent electrode 35 and a collector electrode 36 are formed on the p-type amorphous silicon layer 34.

An intrinsic amorphous silicon layer 37 is formed on the back face side of the n-type single crystalline silicon substrate 31 and an n-type amorphous silicon film 38 is formed on the intrinsic amorphous silicon layer 37. A back electrode 39 and the collector electrode 36 are formed on the n-type amorphous silicon layer 38.

The semiconductor film and electrode on the light incidence side are formed in the following manner.

The intrinsic amorphous silicon layer 32 is formed by a plasma CVD method on the condition of an $SiH_4$ gas flow rate of 10 sccm, a pressure of 53 Pa, a substrate temperature of 170° C. and an RF power of 10 W. A thickness is 4 nm and an optical band gap is 1.54 eV.

The intrinsic amorphous silicon layer 33 is formed by the plasma CVD method on the condition of an $SiH_4$ gas flow rate of 10 sccm, an $H_2$ gas flow rate of 200 sccm, a pressure of 53 Pa, a substrate temperature of 170° C. and an RF power of 10 W. A thickness is 4 nm and an optical band gap is 1.63 eV.

The p-type amorphous silicon layer 34 is formed by the plasma CVD method on the condition of an $SiH_4$ gas flow rate of 10 sccm, a $B_2H_6$ gas (1% $H_2$ base) flow rate of 20 sccm, a pressure of 53 Pa, a substrate temperature of 170° C. and an RF power of 10 W. A thickness is 3 nm.

The transparent electrode 35 is formed by the same method and conditions as the formation of the transparent electrode 15 according to the embodiment shown in FIG. 1.

The semiconductor film and electrode on the back face side are formed in the following manner.

The intrinsic amorphous silicon layer 37 is formed by the plasma CVD method on the condition of an $SiH_4$ gas flow rate of 20 sccm, a pressure of 27 Pa, a substrate temperature of 170° C. and an RF power of 20 W. A thickness is 15 nm and an optical band gap is 1.54 eV.

The n-type amorphous silicon film 38 is formed by the plasma CVD method on the condition of an $SiH_4$ gas flow rate of 20 sccm, a $PH_3$ gas (2% $H_2$ base) flow rate of 10 sccm, a pressure of 27 Pa, a substrate temperature of 170° C. and an RF power of 20 W. A thickness is 22 nm.

The back electrode 39 is formed by the same method and conditions as the formation of the back electrode 19 according to the embodiment shown in FIG. 1.

Figure 5:
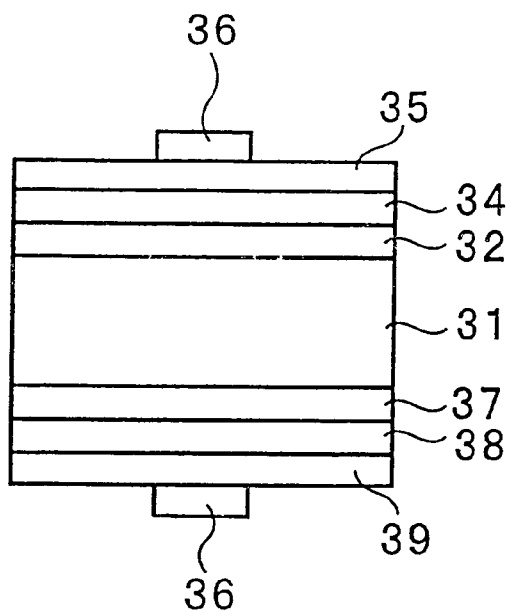
FIG. 5 is a typical sectional view showing a photovoltaic device according to a conventional example for a comparison.

As a photovoltaic device according to a conventional example for a comparison, a photovoltaic device shown in FIG. 5 is fabricated. As shown in FIG. 5, the photovoltaic device has the same structure as that of the embodiment shown in FIG. 4 except that the intrinsic amorphous silicon layer 33 is not formed. The intrinsic amorphous silicon layer 32 has a thickness of 8 nm.

An open circuit voltage and a short circuit current in each of the photovoltaic device according to the third embodiment and the photovoltaic device shown in FIG. 5 are shown in Table 3.

TABLE 3

|  | Voc (V) | Isc (A) |
| --- | --- | --- |
| Conventional example | 0.676 | 3.88 |
| Present invention | 0.710 | 3.83 |

As shown in the Table 3, the photovoltaic device according to the third embodiment of the present invention has the open circuit voltage more enhanced and a conversion efficiency more increased than the photovoltaic device according to the conventional example.

Next, the thickness of the whole intrinsic amorphous semiconductor film is set to be constant, that is, 9 nm and the thicknesses of the first amorphous silicon layer 32 and the second amorphous silicon layer 33 are varied respectively to fabricate the photovoltaic device. Thus, photoelectric conversion characteristics are measured. The result of the measurement is shown in FIGS. 8 to 10.

Figure 8:
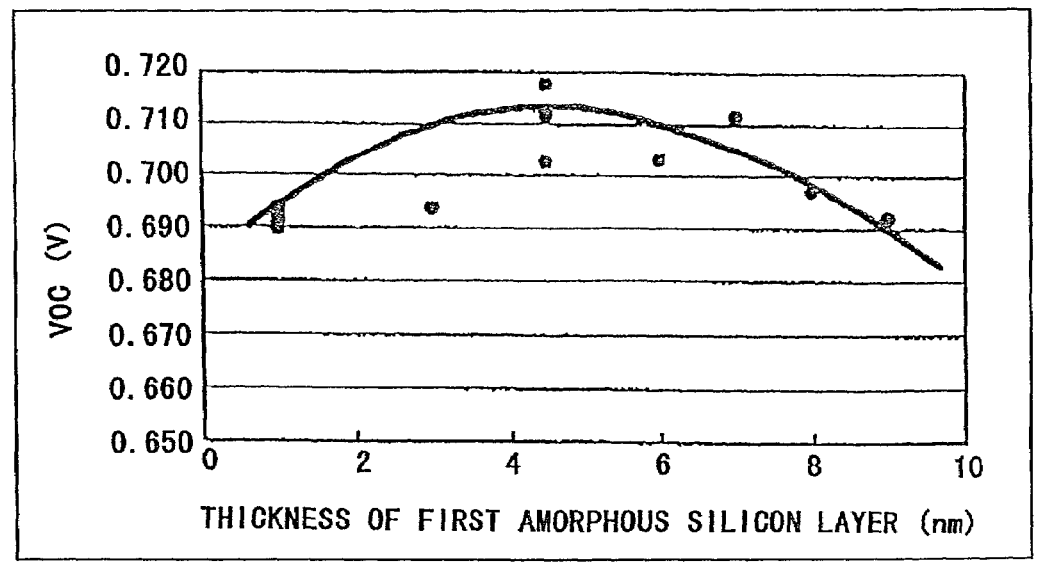
FIG. 8 is a chart showing an open circuit voltage obtained when the thickness of a first amorphous silicon layer is changed in the third embodiment according to the present invention.
Figure 9:
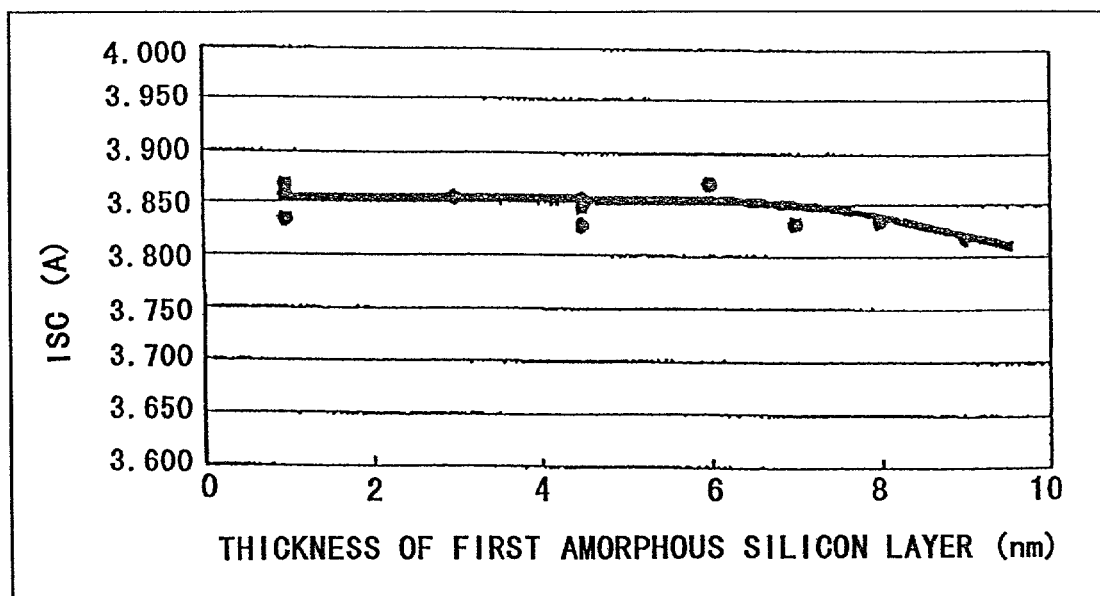
FIG. 9 is a chart showing a short circuit current obtained when the thickness of the first amorphous silicon layer is changed in the third embodiment according to the present invention.
Figure 10:
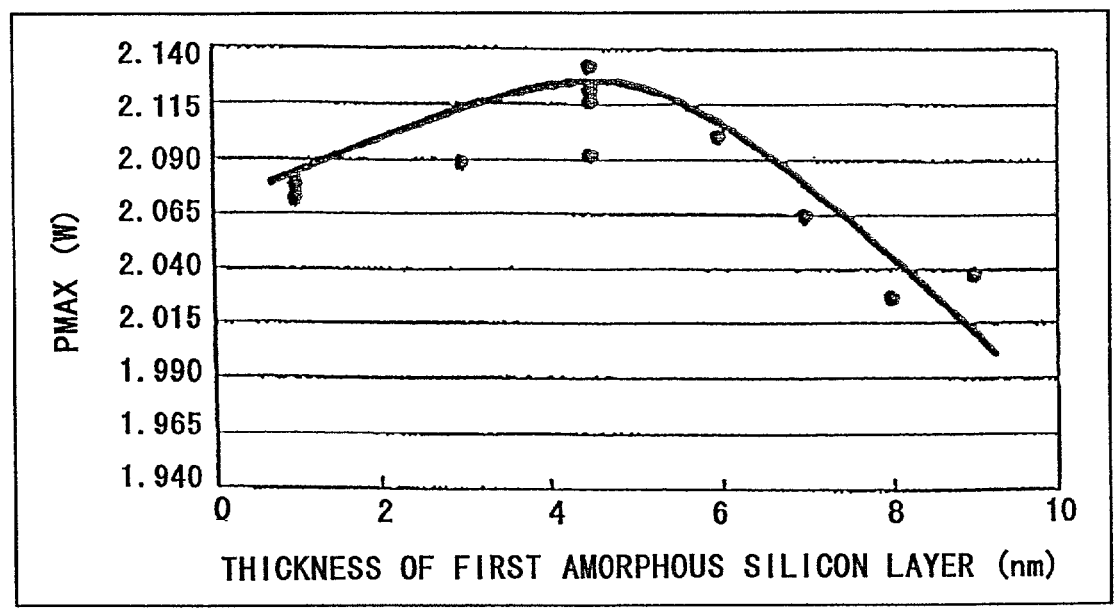
FIG. 10 is a chart showing a maximum output obtained when the thickness of the first amorphous silicon layer is changed in the third embodiment according to the present invention.

As shown in FIGS. 8 to 10, the photovoltaic device according to the present invention can have a higher photoelectric conversion efficiency than that of the photovoltaic device according to the conventional example in which the thickness of the first amorphous silicon layer is 9 nm. As is apparent from FIG. 10, moreover, the photoelectric conversion efficiency can particularly be increased with the first amorphous silicon layer having a thickness of 1 to 7 nm, and furthermore, can be more increased with a thickness of 3 to 6 nm.

While the amorphous silicon carbide layer is used in the first and second embodiments, it has been confirmed that the same effects can be obtained by using an amorphous silicon oxide layer or an amorphous silicon nitride layer in place thereof.

Although the amount of hydrogen to be contained is increased to expand the optical band gap of the amorphous silicon layer in the third embodiment, a raw material gas such as an $SiH_4$ gas may be diluted with a hydrogen gas to increase the amount of hydrogen to be contained, and furthermore, a thin film may be formed by using a He or Ar gas as a diluted gas for a method of expanding the optical band gap. Moreover, it is also possible to form a layer having a large optical band gap by repeating a film forming step using the $SiH_4$ gas and a plasma processing step using a He, Ar or Xe gas to form a film.

Furthermore, the back face side according to the third embodiment shown in FIG. 3 may be set to be a BSF region having the intrinsic amorphous semiconductor film according to the present invention inserted between an n-type single crystalline silicon substrate and a p-type amorphous silicon film as in the second embodiment shown in FIG. 2.

According to the present invention, it is possible to reduce the recombination of photo-generated carriers in a semiconductor junction portion and to enhance a photoelectric conversion efficiency.

What is claimed is:

1. A photovoltaic device comprising:
  a crystalline semiconductor substrate of a first conductivity type, wherein said substrate is a principal power generating layer of said photovoltaic device;
  a non-intrinsic amorphous semiconductor film of said first conductivity type or of a second conductivity type opposite said first conductivity type; and
  an intrinsic amorphous semiconductor film having a thickness of 20 to 250 Å and being interposed directly between said substrate and said non-intrinsic amorphous semiconductor film;
  wherein said intrinsic amorphous semiconductor film has a varied optical band gap with a first optical band gap value on a first side of said intrinsic amorphous semiconductor film contacting said substrate and a second optical band gap value greater than said first optical band gap value on a second side of said intrinsic amorphous semiconductor film contacting said non-intrinsic amorphous semiconductor film;
  wherein said intrinsic amorphous semiconductor film comprises at least a first intrinsic amorphous semiconductor layer being an amorphous silicon layer along said first side having said first optical band gap value and a second intrinsic amorphous semiconductor layer along said second side having said second optical band gap value; and
  wherein said second intrinsic amorphous semiconductor layer is a layer selected from the group consisting of an amorphous silicon carbide layer, an amorphous silicon oxide layer, and an amorphous silicon nitride layer.

2. The photovoltaic device according to claim 1, wherein said non-intrinsic amorphous semiconductor film is of said second conductivity type.

3. The photovoltaic device according to claim 2, wherein said amorphous silicon layer has a thickness of no more than 5 nm.

4. The photovoltaic device according to claim 1, wherein said non-intrinsic amorphous semiconductor film is of said first conductivity type.

5. The photovoltaic device according to claim 4, wherein said amorphous silicon layer has a thickness of no more than 5 nm.

6. A photovoltaic device comprising:
a crystalline semiconductor substrate of a first conductivity type, wherein said substrate is a principal power generating layer of said photovoltaic device;
a non-intrinsic amorphous semiconductor film of a second conductivity type opposite said first conductivity type; and
an intrinsic amorphous semiconductor film having a thickness of 20 to 250 Å and being interposed directly between said substrate and said non-intrinsic amorphous semiconductor film;
wherein said intrinsic amorphous semiconductor film has a varied optical band gap with a first optical band gap value on a first side of said intrinsic amorphous semiconductor film contacting said substrate and a second optical band gap value greater than said first optical band gap value on a second side of said intrinsic amorphous semiconductor film contacting said non-intrinsic amorphous semiconductor film;
wherein said intrinsic amorphous semiconductor film comprises at least a first intrinsic amorphous semiconductor layer being an amorphous silicon layer along said first side having said first optical band gap value and a second intrinsic amorphous semiconductor layer along said second side having said second optical band gap value; and
wherein said amorphous silicon layer of said first intrinsic amorphous semiconductor layer is a first amorphous silicon layer containing a first content of hydrogen, and said second intrinsic amorphous semiconductor layer comprises a second amorphous silicon layer containing a second constant of hydrogen greater than said first content of hydrogen.

7. The photovoltaic device according to claim 6, wherein said first amorphous silicon layer has a thickness of 1 to 7 nm.

8. The photovoltaic device according to claim 6, wherein said varied optical band gap increases monotonously without decreasing through a thickness of said intrinsic amorphous semiconductor film from said first optical band gap value on said first side to said second optical band gap value on said second side.

9. The photovoltaic device according to claim 8, wherein said intrinsic amorphous semiconductor film includes plural layers including said first and second intrinsic amorphous semiconductor layers, and said varied optical band gap increases step-wise from layer-to-layer among said plural layers from said first side to said second side.

10. The photovoltaic device according to claim 8, wherein said varied optical band gap increases smoothly and continuously from said first side to said second side.

11. The photovoltaic device according to claim 6, wherein:
said non-intrinsic amorphous semiconductor film is a first non-intrinsic amorphous semiconductor film; and
said intrinsic amorphous semiconductor film is a first intrinsic amorphous semiconductor film that is interposed directly between a first side of said substrate and said first non-intrinsic amorphous semiconductor film.

12. The photovoltaic device according to claim 11, further comprising:
a second non-intrinsic amorphous semiconductor film that is arranged on a second side of said substrate opposite said first side of said substrate; and
a second intrinsic amorphous semiconductor film interposed directly between said second of said substrate and said second non-intrinsic amorphous semiconductor film;
wherein said second intrinsic amorphous semiconductor film has a varied optical band gap with a third optical band gap value on a first side of said second intrinsic amorphous semiconductor film contacting said second side of said substrate and a fourth optical band gap value greater than said third optical band gap value on a second side of said second intrinsic amorphous semiconductor film contacting said second non-intrinsic amorphous semiconductor film; and
wherein said second intrinsic amorphous semiconductor film comprises at least a third intrinsic amorphous semiconductor layer being an amorphous silicon layer along said first side having said third optical band gap value and a fourth intrinsic amorphous semiconductor layer along said second side having said fourth optical band gap value.

13. A photovolteic device comprising:
a crystalline semiconductor substrate of a first conductivity type, wherein said substrate is a principal power generating layer of said photovoltaic device;
a first non-intrinsic amorphous semiconductor film of said first conductivity type; and
a first intrinsic amorphous semiconductor film having a thickness of 20 to 250 Å and being interposed directly between a first side of said substrate and said first non-intrinsic amorphous semiconductor film;
wherein said intrinsic amorphous semiconductor film has a varied optical band gap with a first optical band gap value on a first side of said intrinsic amorphous semiconductor film contacting said substrate and a second optical band gap value greater than said first optical band gap value on a second side of said intrinsic amorphous semiconductor film contacting said non-intrinsic amorphous semiconductor film;
wherein said intrinsic amorphous semiconductor film comprises at least a first intrinsic amorphous semiconductor layer being an amorphous silicon layer along said first side having said first optical band gap value and a second intrinsic amorphous semiconductor layer along said second side having said second optical ban gap value; and
wherein said amorphous silicon layer of said first intrinsic amorphous semiconductor layer is a first amorphous silicon layer containing a first content of hydrogen, and said second intrinsic amorphous semiconductor layer comprises a second amorphous silicon layer containing a second content of hydrogen greater than said first content of hydrogen.

14. The photovoltaic device according to claim 13, wherein said first amorphous silicon layer has a thickness of 1 to 7 nm.

15. The photovoltaic device according to claim 13, further comprising:

a second non-intrinsic amorphous semiconductor film that has a second conductivity type opposite said first conductivity type and that is arranged on a second side of said substrate opposite said first side of said substrate; and a second intrinsic amorphous semiconductor film interposed directly between said second side of said substrate and said second non-intrinsic amorphous semiconductor film;

wherein said second intrinsic amorphous semiconductor film has a varied optical band gap with a third optical band gap value on a first side of said second intrinsic amorphous semiconductor film contacting said second side of said substrate and a fourth optical band gap value greater than said third optical band gap value on a second side of said second intrinsic amorphous semiconductor film contacting said second non-intrinsic amorphous semiconductor film; and wherein said second intrinsic amorphous semiconductor film comprises at least a third intrinsic amorphous semiconductor layer being an amorphous silicon layer along said first side having said third optical band gap value and a fourth intrinsic amorphous semiconductor layer along said second side having said fourth optical band gap value.

* * * * *

UNITED STATES PATENT AND TRADEMARK OFFICE
CERTIFICATE OF CORRECTION

PATENT NO. : 7,030,413 B2 Page 1 of 1
APPLICATION NO. : 09/947317
DATED : April 18, 2006
INVENTOR(S) : Nakamura et al.

It is certified that error appears in the above-identified patent and that said Letters Patent is hereby corrected as shown below:

Title page,
Item [57], Abstract,
Delete and replace the Abstract to read as follows:

A photovoltaic device includes a thin intrinsic amorphous semiconductor film inserted in a junction portion between a crystalline semiconductor substrate and an amorphous semiconductor film which have conductivity types opposite each other. An optical band gap of the intrinsic amorphous semiconductor film is expanded on a side in contact with the amorphous semiconductor film.

Column 3, Line 67
Last line, after "layer 13.", replace "Ap-type" by --A p-type--.

Column 9,
Line 44, after "a second", replace "constant" by --content--.

Column 10,
Line 11, after "said second", insert --side--.
Line 30, after "A", replace "photovolteic" by --photovoltaic--;
Line 54, after "second optical", replace "ban" by --band--.

Signed and Sealed this

Twelfth Day of December, 2006

JON W. DUDAS
*Director of the United States Patent and Trademark Office*